United States Patent [19]
Suzuki

[11] Patent Number: 5,655,030
[45] Date of Patent: Aug. 5, 1997

[54] METHOD FOR DETECTING THE CENTER OF TARGET MARKS BY IMAGE PROCESSING

[75] Inventor: Takashi Suzuki, Aichi-ken, Japan

[73] Assignee: UHT Corporation, Aichi-ken, Japan

[21] Appl. No.: 362,981

[22] Filed: Dec. 23, 1994

[30] Foreign Application Priority Data

| Dec. 27, 1993 | [JP] | Japan | 5-331856 |
| Apr. 7, 1994 | [JP] | Japan | 6-069435 |
| Oct. 20, 1994 | [JP] | Japan | 6-255508 |

[51] Int. Cl.$^6$ ............................................. G06K 9/00
[52] U.S. Cl. ............................ 382/152; 382/287; 348/95
[58] Field of Search ................................. 382/103, 141, 382/152, 199, 270, 287, 288, 291; 358/466; 348/87, 94, 95; 356/375, 384

[56] References Cited

U.S. PATENT DOCUMENTS

| 4,491,962 | 1/1985 | Sakou et al. | 382/50 |
| 4,647,208 | 3/1987 | Bieman | 356/375 |
| 4,829,375 | 5/1989 | Alzmann et al. | 358/101 |
| 5,086,478 | 2/1992 | Kelly-Mahaffey et al. | 382/8 |
| 5,351,316 | 9/1994 | Kakimoto | 382/65 |

FOREIGN PATENT DOCUMENTS

| 62-37856 | 2/1987 | Japan | 382/288 |
| 62-159292 | 7/1987 | Japan | 382/141 |
| 3-50608 | 3/1991 | Japan | G05D 3/12 |
| 4-171585 | 6/1992 | Japan | G06F 15/70 |
| 5-256626 | 10/1993 | Japan | 382/270 |
| 94/20925 | 9/1994 | WIPO | 382/287 |

OTHER PUBLICATIONS

English language abstract of JP 4–171585.
English language abstract of JP 3–50608.
Copy of Official Japanese Action issued (on Sep. 5, 1995) in Japanese Application No. 5–124181 filed May 26, 1993.
English Translation of Japanese Kokai 5–256626, Katayama et al., Oct. 1993.

*Primary Examiner*—Andrew Johns
*Attorney, Agent, or Firm*—Greenblum & Bernstein P.L.C.

[57] ABSTRACT

A method for accurately determining a center of target marks provided on a workpiece. The method involves imaging, at an imaging station, a circular target mark associated with the workpiece. A signal produced by the imaging operation is binary-encoding, in an image processor, and displayed on a monitor screen connected to said image processor. Starting points X1 and X2 of a different level of intensity are detected by scanning in one of either an X-axis direction or a Y-axis direction on a center of a cursor (shown on the monitor screen) when the center of the cursor is within the target mark. Other starting points Y1 and Y2 of a different level of intensity are detected by scanning in another of the X-axis direction or the Y-axis direction on a mid-point of coordinates of the starting points X1 and X2. Still other starting points X1' and X2' of a different level of intensity are detected by scanning, in parallel to the direction of the starting points X1 and X2, on a mid-point of coordinates of the starting points Y1 and Y2. A reference value of a diameter in the X-axis direction and the Y-axis direction of the target mark stored in a memory (ROM) is compared with a distance between Y1 and Y2 and a distance between X1' and X2', in order to determine an intersection point 0 of segments between points Y1 and Y2 and X1' and X2' as the center of the target mark when the comparison matches.

6 Claims, 15 Drawing Sheets

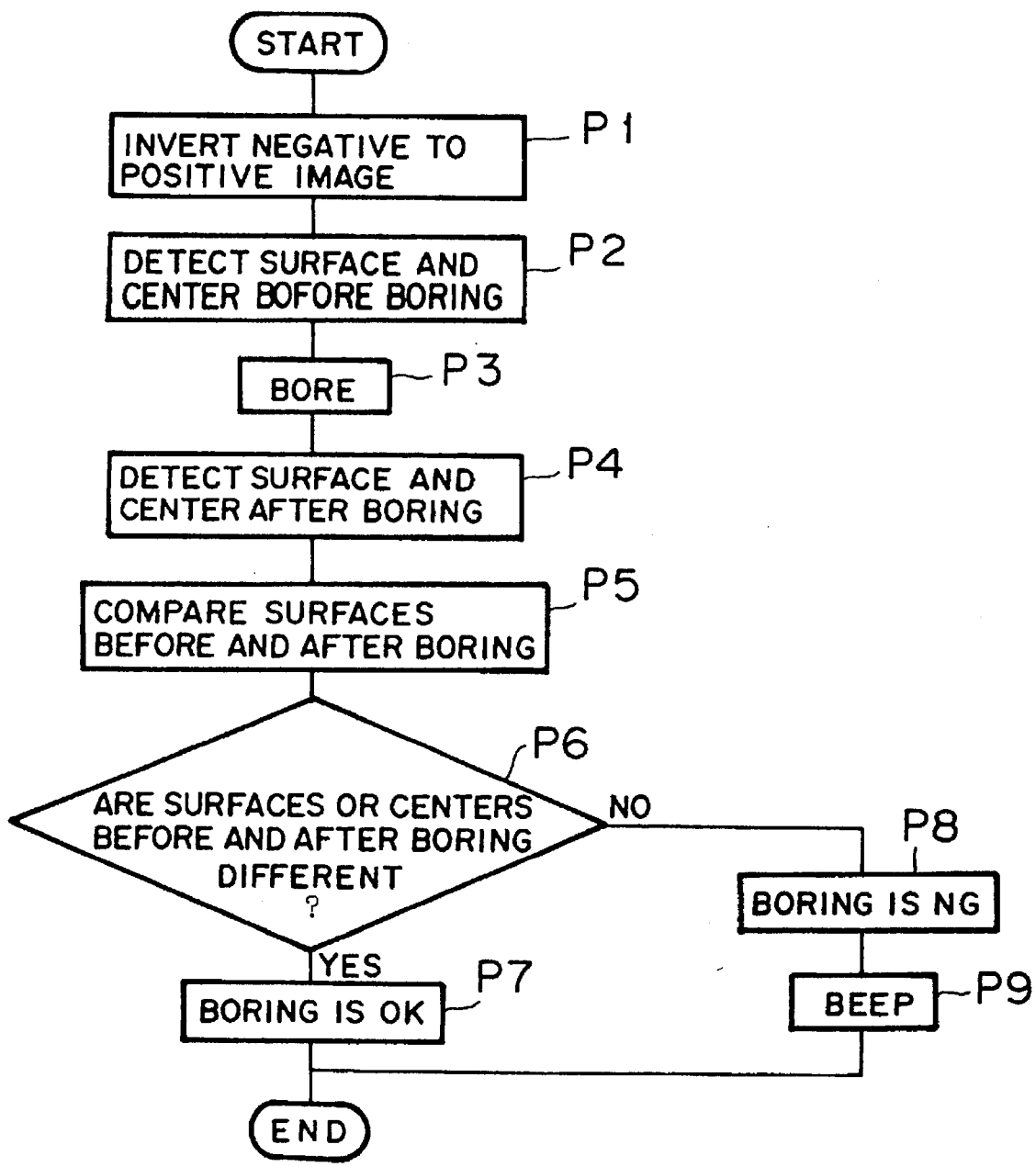

METHOD FOR DETECTING THE CENTER OF TARGET MARKS BY IMAGE PROCESSING

BACKGROUND OF THE INVENTION

1. Field of the Invention

The present invention is related to a method for detecting the center of target marks by image processing, wherein the center position of the target marks may be provided by such means as printing on such workpiece as printed circuit board for boring on it.

2. Background and Material Information

In workpieces, such as printed circuit boards, in order to bore reference holes, target marks made of copper foil print are provided on four corners of the workpiece. Then, the workpiece is moved by a workpiece driving apparatus onto a table, such that each of the target marks come in position just beneath an imaging station. Also, the center position of each target mark is detected by any one of a predetermined means. The boring machine is slightly moved (movement for correction) in the directions of the X and Y axes with an X and Y axis driving mechanism, respectively, by the amount of difference between the detected center position of the target mark and the drilling position, to align the detected center position with the center of the drilling device. Next, the drilling device is moved up by a Z axis driving mechanism to bore a reference hole in the center which coincides with the center of the target mark.

At this point, it is worth noting that since the reference hole is provided to determine the reference position when, for example, circuits are printed on a workpiece, it is required for the reference hole to be bored at the theoretically correct position.

The center of the target marks has been determined by analog to digital (A/D) converting a monochrome image signal to a digital signal at the A/D converter, as well as by converting the digital signal to binary data at an image processor to display on a monitor (CRT) to measure the gravity center using a dynamic window method.

The target marks are formed, for example, by printing round copper foil, or by providing a plurality of concentric circles by printing circular copper foil on the workpiece between the center portion of the substrate of the workpiece and the peripheral portion of the substrate of the workpiece.

For the measurement of the gravity center, if any pattern other than the target marks was converted to black-and-white image by binary conversion, that pattern may significantly affect the coordination of black-and-white conversion, so that problems arise with the accuracy of the detection of the center of target marks.

SUMMARY OF THE INVENTION

An object of the present invention is to overcome the above-mentioned problems by providing a method for detecting the center of target marks with great accuracy.

The technical means of the present invention for solving the problems comprises: detecting a circular target mark provided on a workpiece by an image sensor; binary converting an image signal in an image processor; displaying the binary image on a monitor screen connected to the image processor; scanning in either one of an X axis or a Y axis direction within the center of a cursor when the center of the cursor is in the target marks in order to detect starting points X1 and X2 at which the gradation is different; scanning in another axial direction on the midpoint of the coordinates X1 and X2 in order to detect starting points Y1 and Y2 of a different gradation; scanning in the axial direction, parallel to the axial direction of X1 and X2, on the midpoint of the coordinates Y1 and Y2 in order to detect starting points X1' and X2' of the different gradation; and determining two intersections of respective starting points Y1 and Y2 with X1' and X2' as the center of the target mark if the distance between the starting points Y1 and Y2 and the distance between the starting points X1' and X2' match a reference value stored in a memory of the diameters of target marks in the direction of the X and Y axes.

According to the means of the present invention, the center of the target marks can be accurately detected without influence from any pattern other than the target marks, even if the workpiece was moved with such moving error that the circular target mark aligns to the center of the cursor on the monitor display.

BRIEF DESCRIPTION OF THE DRAWINGS

FIG. 24 is the program chart applicable to the view of FIG. 23.

DESCRIPTION OF THE PREFERRED EMBODIMENTS

With reference to the drawings, the embodiments of the present invention will now be described in detail.

Figure 1:
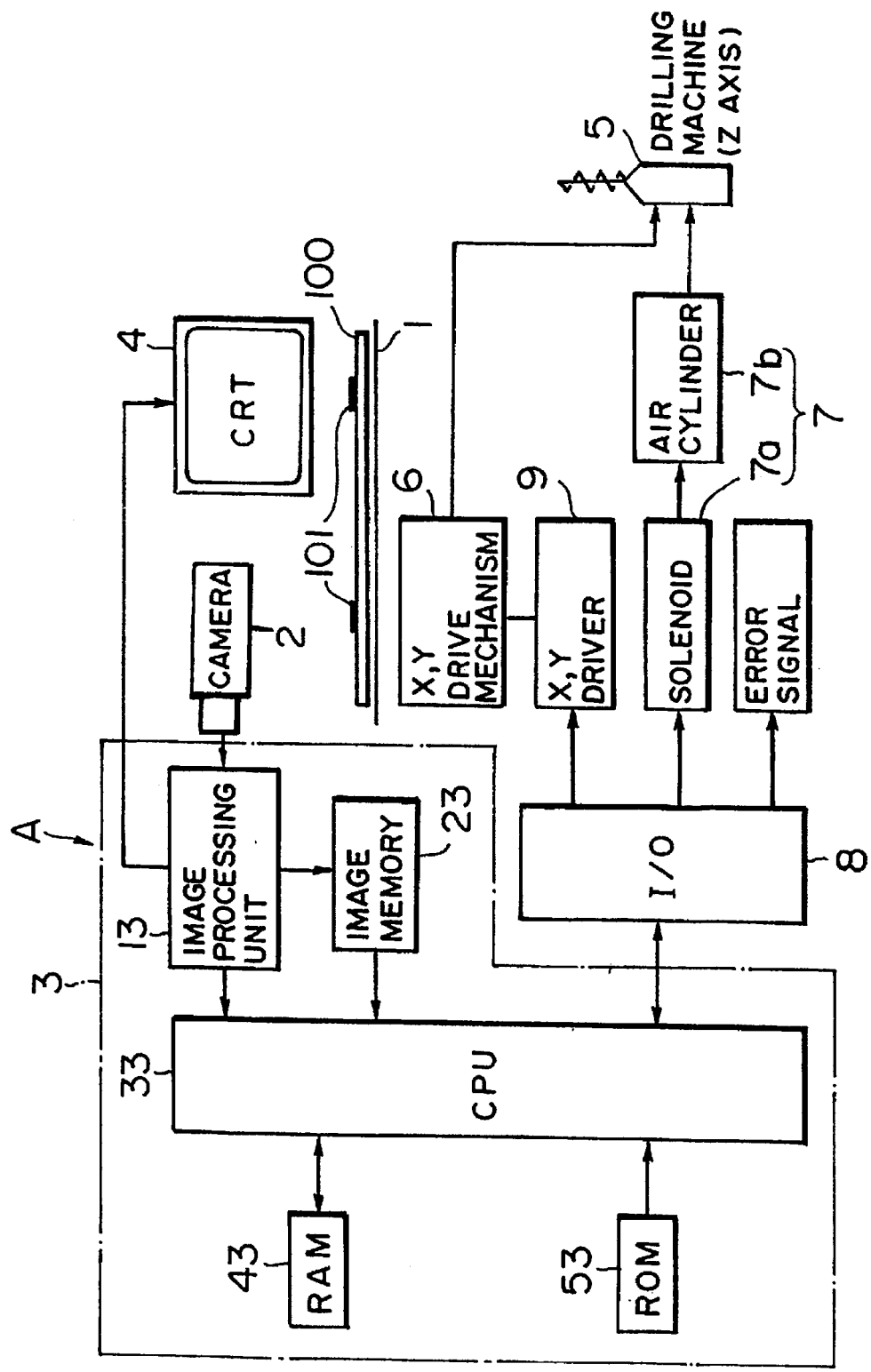
FIG. 1 is a block diagram of an apparatus for achieving the method of detecting the center position of target marks using an image processing apparatus according to a first embodiment of the present invention.
Figure 2:
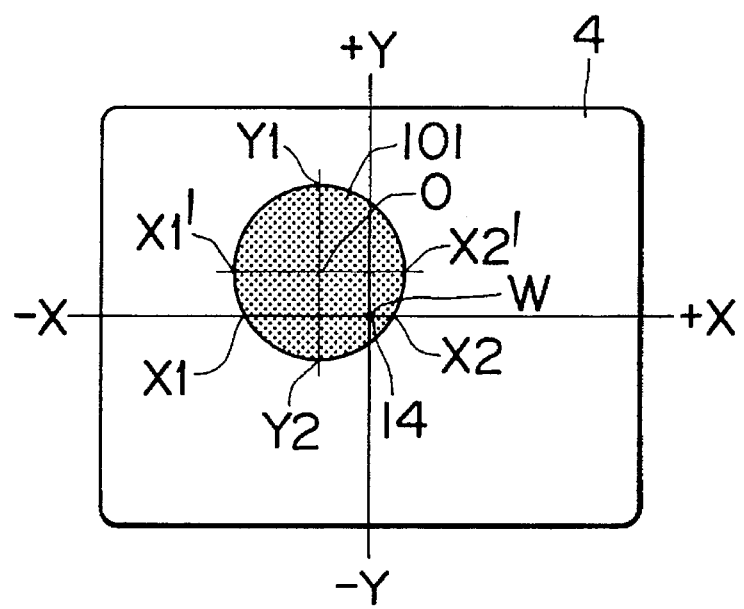
FIG. 2 is a schematic diagram of the detection of a center, indicating the relationships between a monitor screen, a binary image, and a center of a cursor.
Figure 4:
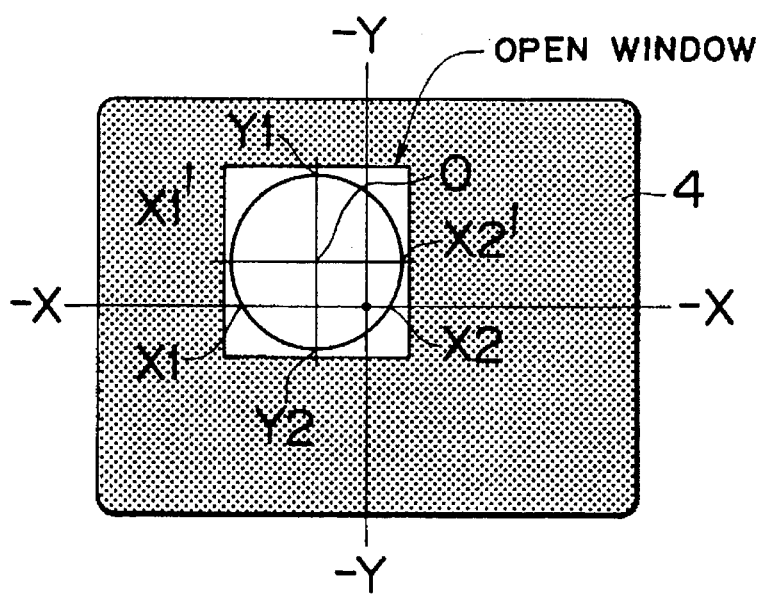
FIG. 4 is a schematic diagram of the measurement of a gravity center indicating the relationships between a monitor screen, a binary image, a cursor, and a window according to a second embodiment of the present invention.
Figure 3:
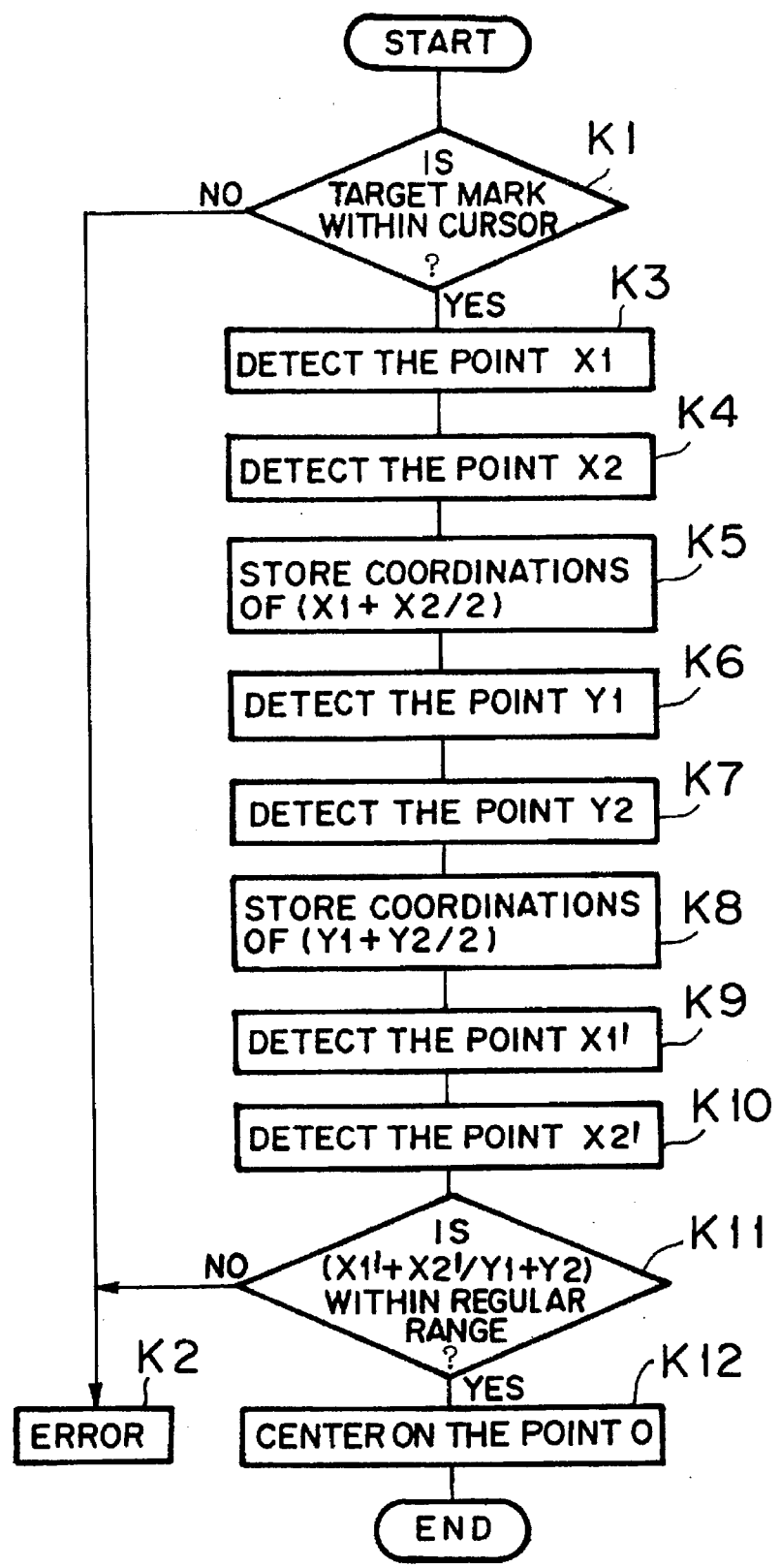
FIG. 3 is a program chart of the first embodiment of the present invention.
Figure 5:
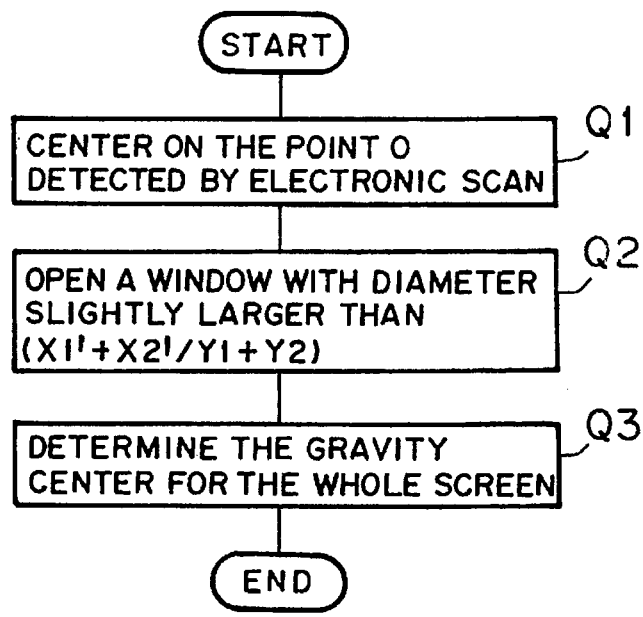
FIG. 5 is a program chart of the second embodiment of the present invention.
Figure 10:
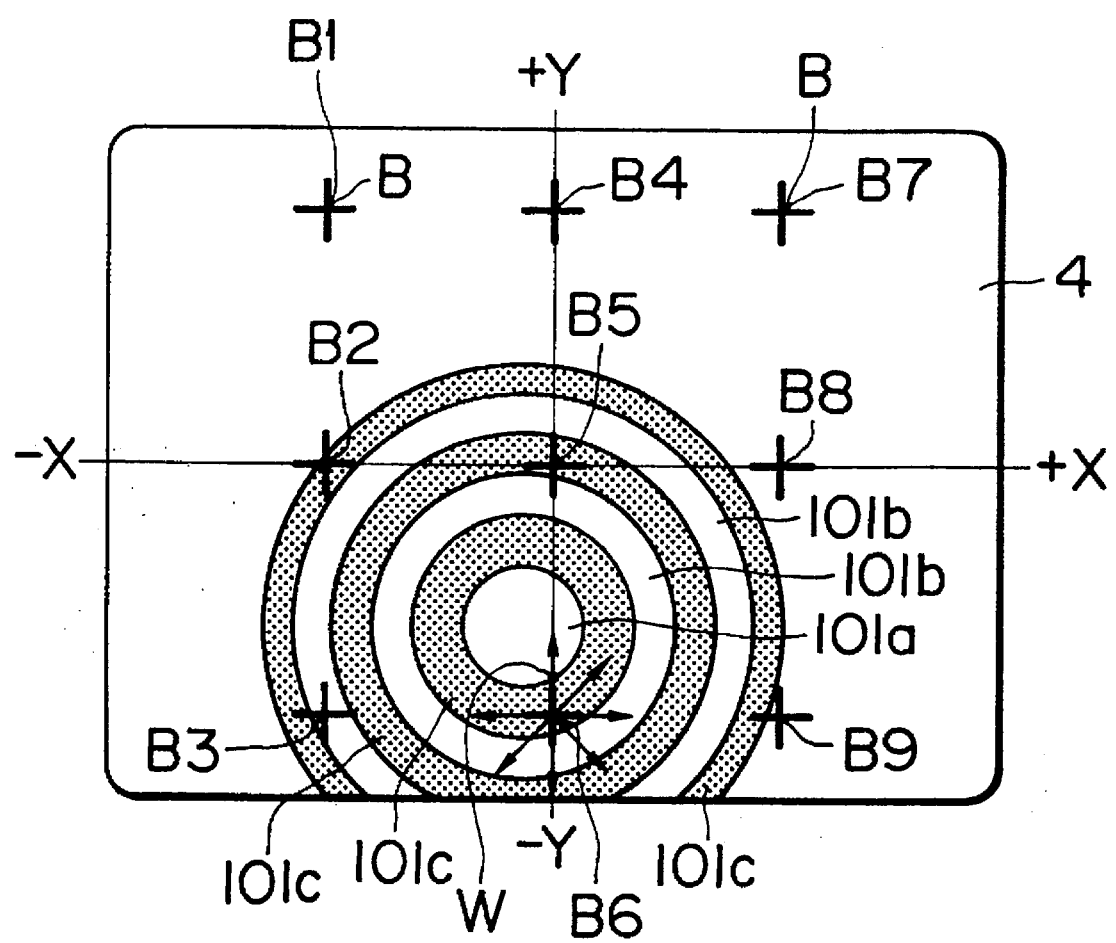
FIG. 10 is an enlarged view of the monitor screen detecting the center of the innermost circle of the target mark according to a fourth embodiment of the present invention.
Figure 11:
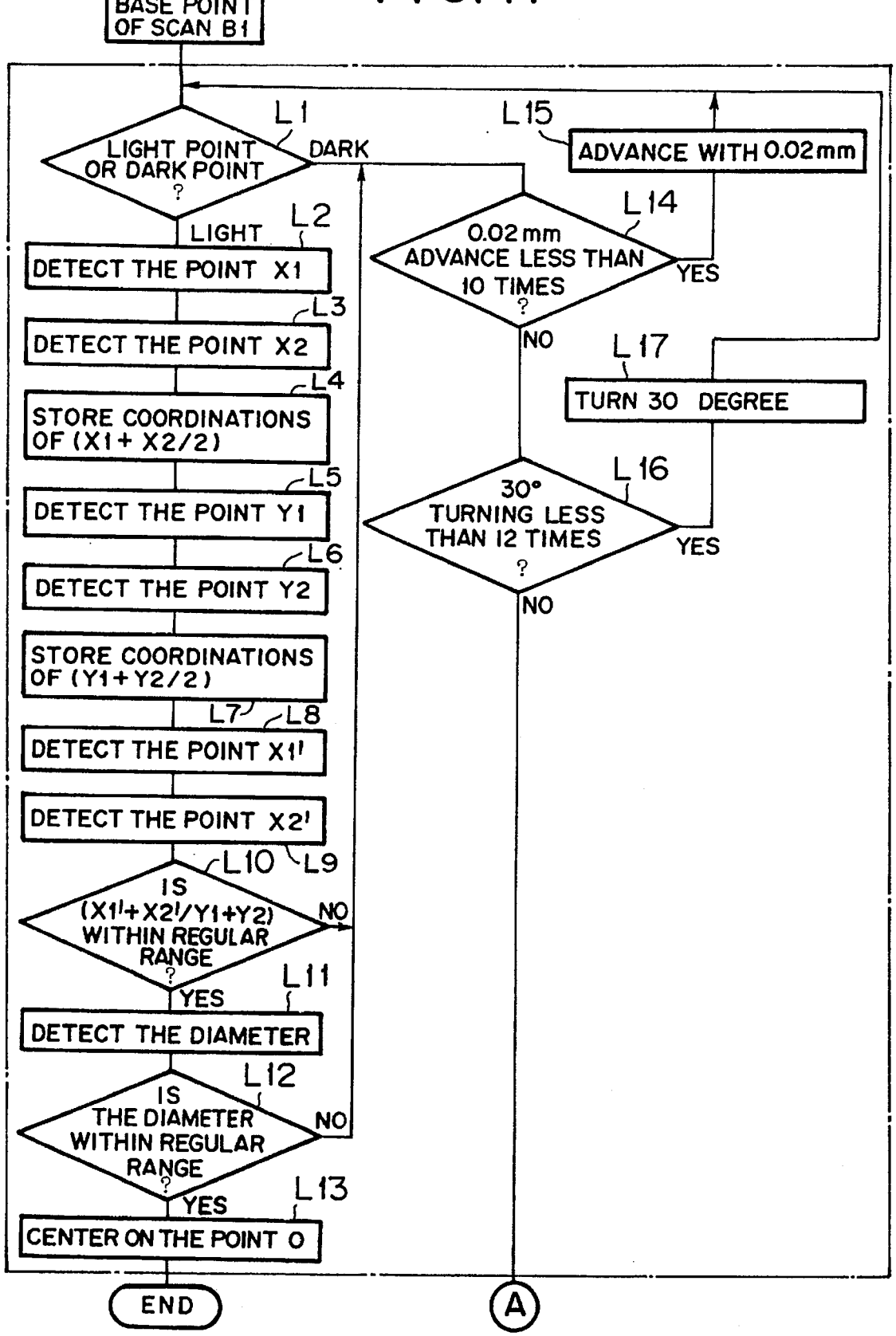
FIG. 11 is a program chart of the fourth embodiment of the present invention indicating the scan based on the reference point.
Figure 12:
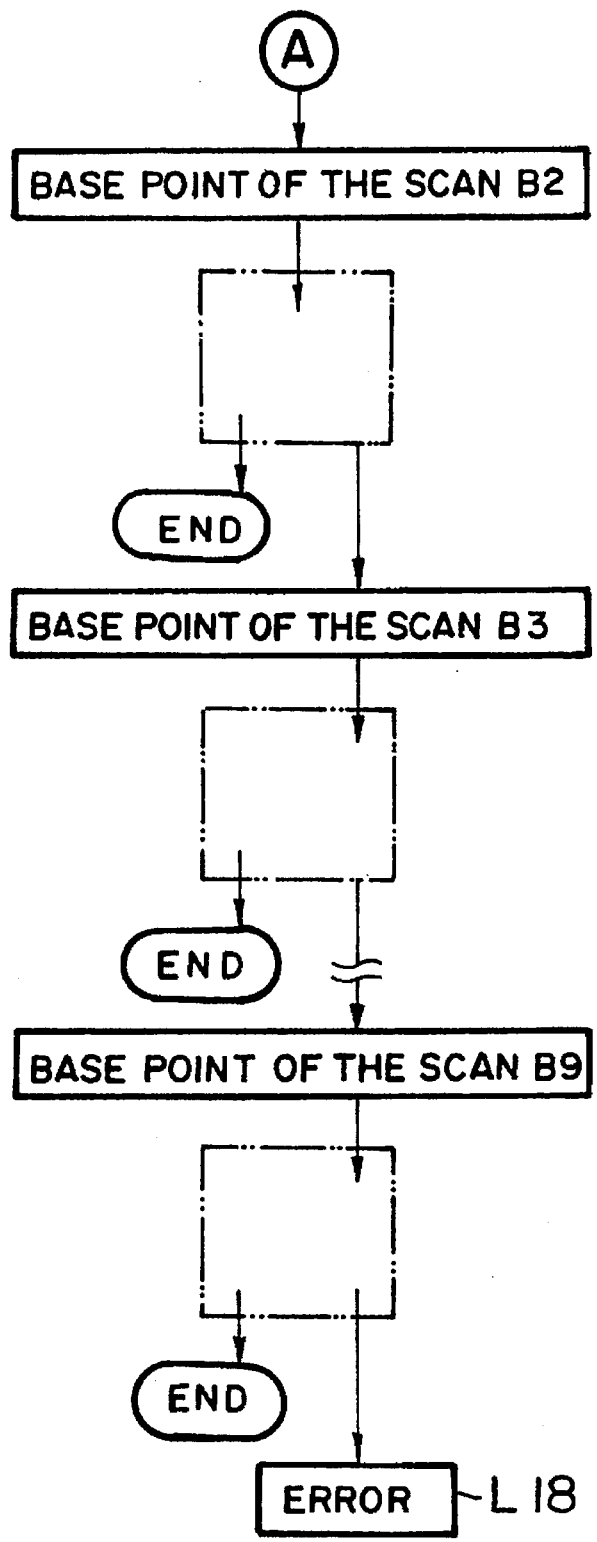
FIG. 12 is another program chart of the fourth embodiment of the present invention indicating the scan based on reference points B2 and B9.
Figure 13:
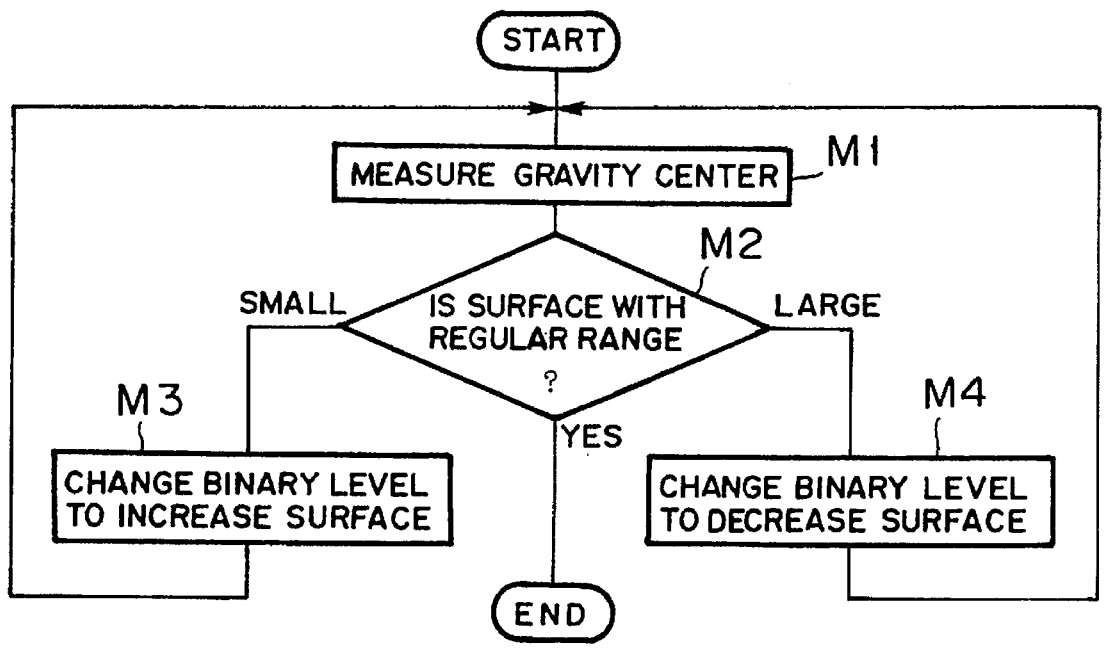
FIG. 13 is a program chart of a fifth embodiment of the present invention.
Figure 14:
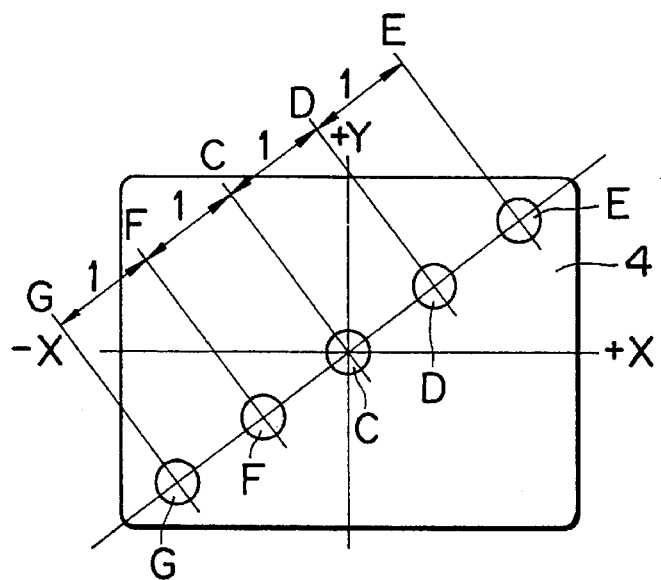
FIG. 14 is an enlarged view of the monitor screen indicating the relationships between holes C, D, E, F, and G.
Figure 15:
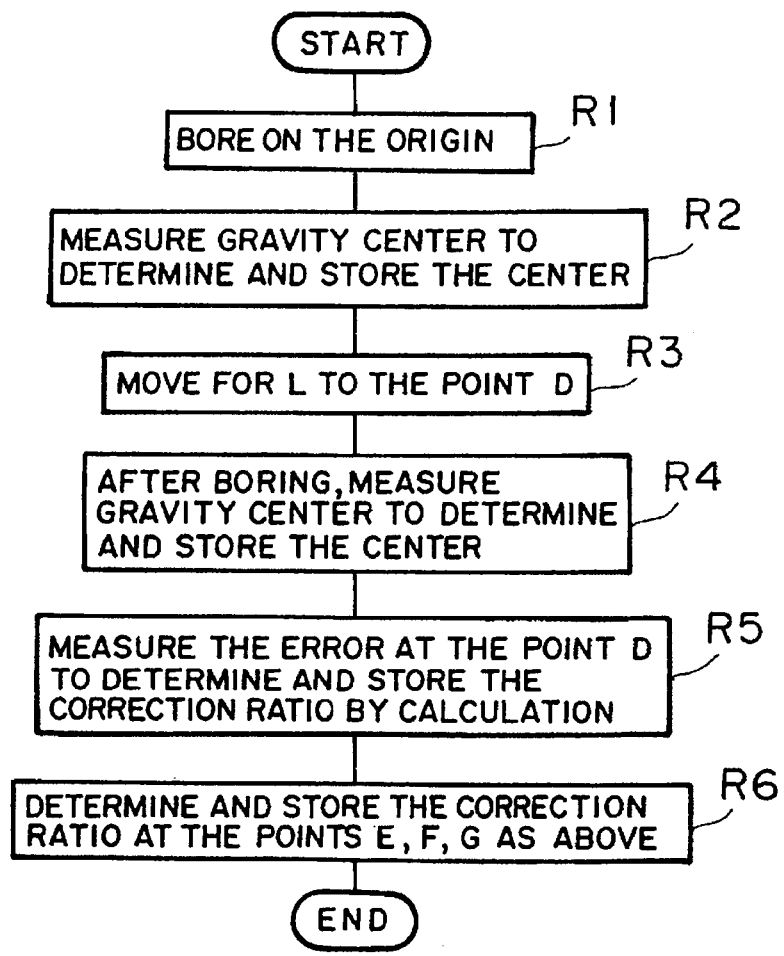
FIG. 15 is a program chart of a sixth embodiment of the present invention.
Figure 16:
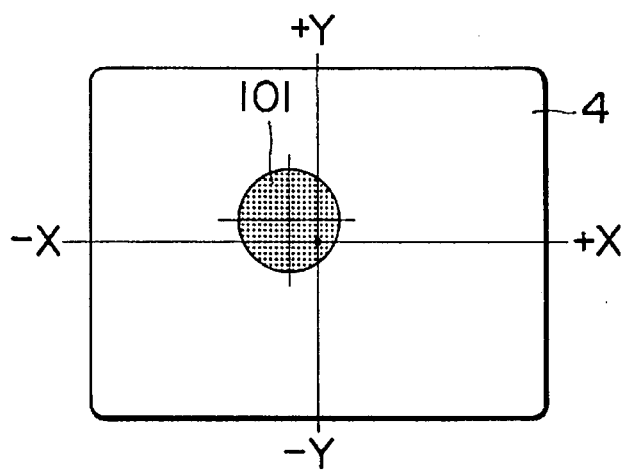
FIG. 16 is an enlarged view of the monitor screen indicating binary image of the processed target mark.

FIG. 1 to FIG. 3 show a first embodiment of the method for detecting a center position of target marks using an image processor according to the present invention. FIGS. 4 and 5 show a second embodiment. FIG. 6 to FIG. 9 show a third embodiment. FIG. 10 to FIG. 12 illustrate a fourth embodiment. FIG. 13 illustrates a fifth embodiment. FIG. 14 and FIG. 15 illustrate a sixth embodiment. FIG. 16 to FIG. 20 show a seventh embodiment, and FIG. 21 to FIG. 24 illustrate an eighth embodiment.

The first embodiment of the present invention will be explained below.

Boring apparatus A comprises an imaging station (camera) 2 on a table 1, for capturing a transmission image obtained by illuminating from under the table 1 (or reflected image obtained by illuminating from above) a target mark 101 of a workpiece 100, such as a printed circuit board transported along with the table 1 by a workpiece transport apparatus (not shown). An image processor 3 binary-encodes the image signal captured at the imaging station 2 using image processing. A monitor 4 displays the binary-coded image. A drilling machine, provided under a drill guide hole (not shown) of the table 1 opposed to the imaging station 2 drills a hole into the printed circuit board. An X- and Y-axis driving mechanism 6 and Z-axis driving mechanism 7 of the boring machine controls the drilling machine 5.

The target mark 101 is formed by printing a circular copper foil having a diameter of approximately 1 mm, onto the four corners of the workpiece 100. The workpiece 100 is then driven by the automated workpiece transport (not shown), such that it is located just beneath the imaging station (camera) 2.

The image processor 3 includes an image processing unit 13 for binary-encoding (processing) the image signal produced by the imaging station (camera) 2, an image memory 23 for storing the binary-encoded data, RAM 43, and ROM 53 for storing data needed by CPU 33. In the image processor 3, each time the automated workpiece transport (not shown) drives the workpiece 100 so as to coincide the center of the target marks 101 provided on the workpiece 100 with the center of the cursor of the monitor screen 4, an image is captured at the imaging station 2 so as to binary-encode the image signal in the image processing unit 13 to store the binary-encoded data in the image memory 23, as well as to display the binary-encoded data on the monitor 4 to scan the binary-encoded image at the pitch of one pixel from the center of cursor 14 to detect the center of the target mark 101, so as to determine a difference between the center of cursor 14 and the detected center of the target mark 101.

The central processing unit (CPU) 33 of the boring machine executes its control program for detecting the center of the target mark 101 each time the workpiece 100 is driven by the workpiece transporting apparatus (not shown), so as to coincide the target mark 101 of the workpiece 100 with the center of the cursor 14.

At the image processing unit 13, a threshold level for a black-and-white discrimination is set so as to determine either a black or a white for a level higher than the threshold, while a white or a black is determined for a level lower than the threshold.

The control program is contained in the ROM 53, which detects the center of the target mark 101 if the center of the cursor 14 of the monitor screen 4 is located within the circular target mark 101.

The control program will now be described in detail with reference to an enlarged view of the monitor screen, as shown in FIG. 2, for indicating the scanning of the binary image processed by the image processor 3. A flow chart of the program to be executed by the central processing unit 33 of the boring machine A is shown in FIG. 3.

The target mark 101 is captured and converted to an image signal at the imaging station 2. Then, the image signal is processed by the image processing unit 13 to be enlarged and displayed on the monitor screen 4.

At first, it is determined whether the center of the cursor 14 is located within the target mark 101 (step K1).

If the center of the cursor 14 is not located within the binary-encoded image of the target mark 101, it is determined that the workpiece driving mechanism has a driving error (e.g., out-of-range), so that the process is treated as an error.

Then, if the center of the cursor 14 is located within the binary-encoded image of the target mark 101, by scanning in the X-axis direction at the pitch of one pixel by starting from the center of cursor 14 as a starting point W, point X1 and the point X2 are detected at which the change of level of intensity starts (steps K3, K4). The mid-point of the coordinates X1 and X2 are calculated and stored in the RAM 43 (step K5). Then, scanning in the Y-axis direction at a pitch of one pixel at the position of the mid-point coordinates occurs to detect point Y1 and point Y2 at which the level of intensity changes (steps K6, K7). The mid-point of the coordinates Y1 and Y2 are calculated and stored in the RAM 43 (step K8).

Next, by scanning from the mid-point in the X-axis direction at a pitch of one pixel, point X1' and point X2', at which the level of intensity changes (steps K9, K10), are detected.

Furthermore, the distances between Y1 and Y2, and X1' and X2' are compared with the previously taught diameter reference value of the target mark 101 (step K11). If the comparison matches, these distances are recognized as the diameter. The intersection O of two pairs of crossing segments of points Y1 and Y2 and X1' and X2' are determined to be defined as the center of the target mark 101 (step K12). The distance between Y1 and Y2 and/or between X1' and X2' is compared to determine whether the target mark 101 is located out of range for the diameter reference value. If the comparison is not matched, it is determined that the target mark 101 does not have a preferred size and shape, so that the process is treated as an error (step K2).

Finally, the results of processing are transmitted through I/O port 8 to instruct external devices, such as the X- and Y-axis driver circuit 9 so that the X- and Y-axis driver circuit controls the driving amount of the X- and Y-axis driving mechanism to drive the boring device 5 just beneath the intersection point O which is at the center of the target mark 101, and to move up the boring device 5 by the Z-axis driving mechanism 7 (which comprises solenoid 7a and air-cylinder 7b) at that position in order to bore a reference hole (not shown).

The second embodiment of the present invention will now be described with reference to FIG. 5. After the center of the target mark 101 is detected according to the first embodiment (step Q1), a window that is slightly larger than the distance between Y1 and Y2 and the distance between X1' and X2' is opened (step Q2). Then, the center of gravity of the window area in the monitor screen 4 is measured to accurately determine the center of the target mark 101 (step Q3).

It should be noted that the measurement is achieved by masking the area outside the window.

The third embodiment of the present invention will now be described. In this embodiment, the target mark 101 is formed by providing a plurality of concentric circular portion 101c that is made by copper foil printing at the area between the central portion 101a of the substrate of the workpiece 100 and the circumference 101b of the substrate of the workpiece. The center of the target mark 101 is detected, even if the driving error of the workpiece driving mechanism (not shown) is relatively large, such that the center of the cursor 14 of the monitor screen 4 is located in a printed portion 101c next to an innermost central portion 101a. The control program of this embodiment is contained in the ROM 53.

Figure 6:
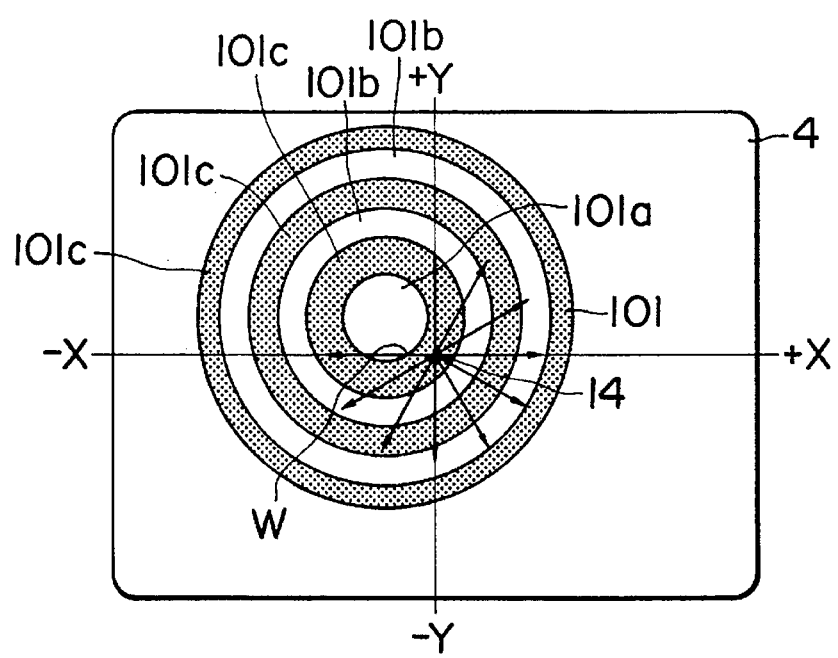
FIG. 6 is an enlarged view of the monitor screen scanning when the center of the cursor is located in the outer circle next to an inner circumference of a central circle of the binary image of a target mark.
Figure 7:
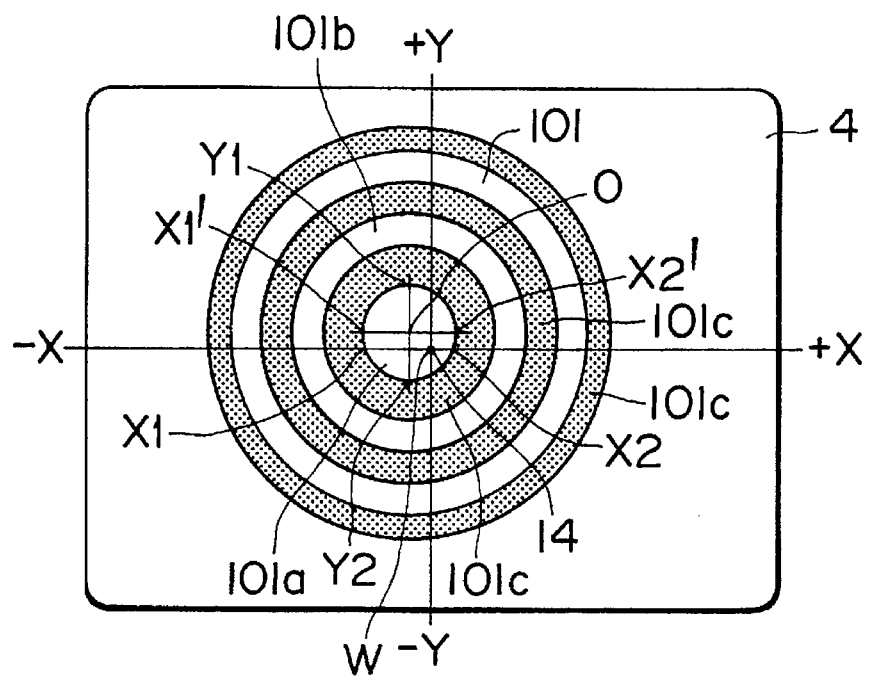
FIG. 7 is an enlarged view of the monitor screen scanning when the center of the cursor is located within an innermost circle of the target mark.
Figure 8:
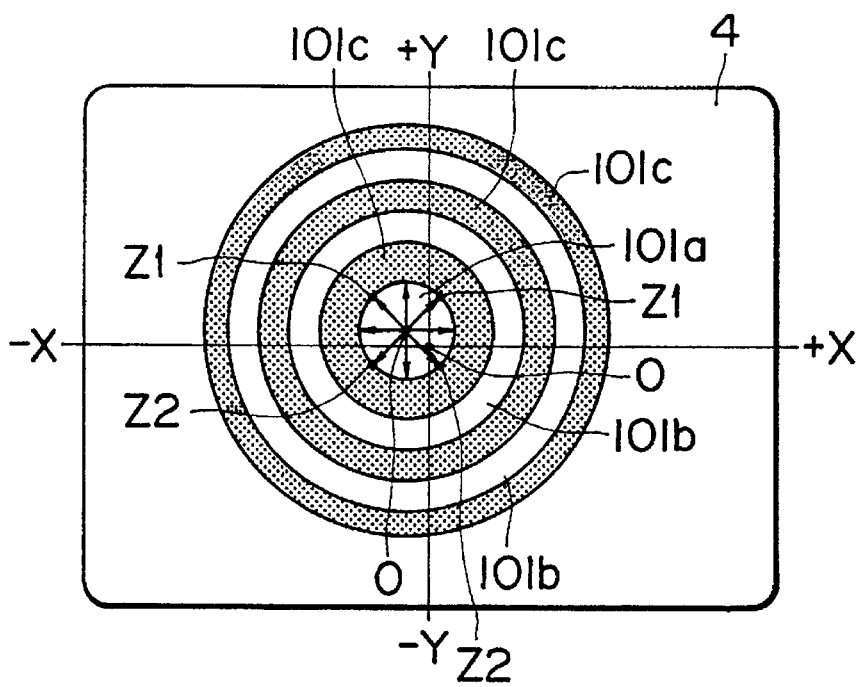
FIG. 8 is an enlarged view of the monitor screen scanning the innermost circle of the target mark in a direction intersecting a hypothetical center (intersection O)
Figure 9:
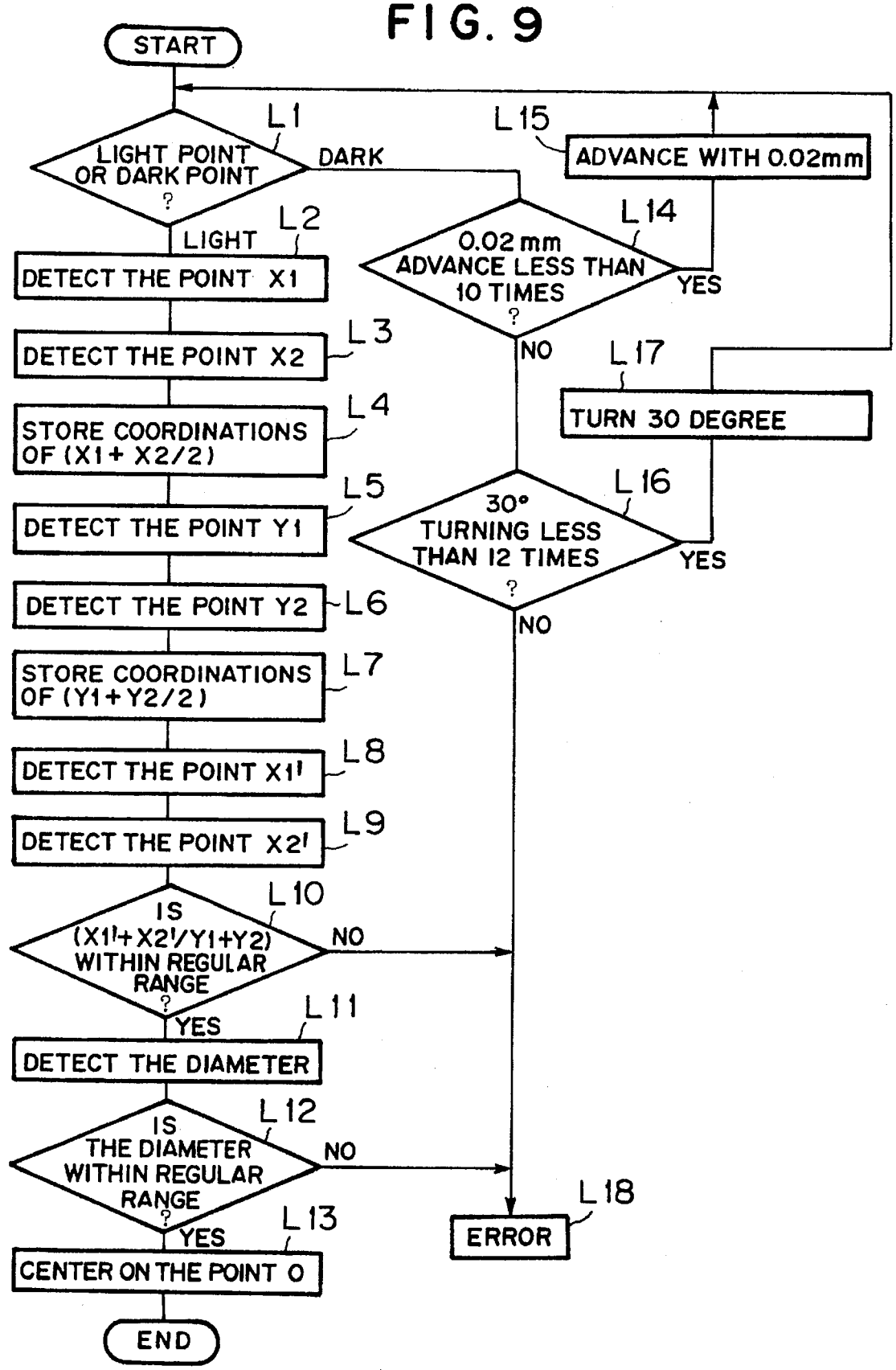
FIG. 9 is a program chart of a third embodiment of the present invention.

The control program will now be described in detail, with reference to the enlarged view of the monitor screen indicating scanning of the binary-encoded image processed in the image processor as shown in FIG. 6 to FIG. 8, and the flow chart of the program which is to be executed at the central processing unit of the boring machine as shown in FIG. 9.

The target mark 101 is captured and converted to an image signal at the imaging station 2. Then, the image signal is binary-encoded by the image processing unit 13 to be enlarged and displayed on the monitor screen 4.

At first, it is determined whether the center of the cursor 14 is located in the center portion 101a of the target mark 101 (step L1).

If the center of the cursor 14 is located in the center portion 101a of the target mark 101, as shown in FIG. 7, by scanning in the X-axis direction at a pitch of one pixel, by starting from the center of the cursor 14 as a starting point W, the point X1 and the point X2 are detected at which the level of intensity is different from the center portion 101a (steps L2, L3). The mid-point of the coordinates X1 and X2 are calculated and stored in the RAM 43 (step L4).

Next, scanning in the Y-axis direction, at a pitch of one pixel, is performed at the position of the mid-point coordinates to detect point Y1 and point Y2 at which the level of intensity changes from the center portion 101a (steps L5, L6). The mid-point of the coordinates Y1 and Y2 are calculated and stored in the RAM 43 (step L7).

Then, by scanning from the mid-point in the X-axis direction, at a pitch of one pixel, point X1' and point X2' are detected at which the level of intensity changes from the center portion 101a (steps L8, L9).

Furthermore, the distances between Y1 and Y2, and X1' and X2' are compared with the diameter reference value of the center portion 101a of the target mark 101 previously taught and contained in the ROM 53 (step L10). If the comparison matches, these distances are recognized as the diameter. In addition, the intersection O of two pairs of crossing segments between points Y1 and Y2 and X1' and X2' is determined to be defined as the center of the target mark 101, and is stored in the RAM 43 (step L11).

In addition, even when the diameter in the direction of the X-axis and the Y-axis matches with the reference value previously taught in ROM 53, further scanning in a diagonal or radial direction which cross at the intersection point 0 (hypothetical center) with a preferable gradient may be performed to detect points Z1 and Z2 at which the gradation of the image differs. The target mark is recognized as being round only if the distance between detected point Z1 and Z2 matches the previously taught diameter. Then, intersection 0, the hypothetical center, is defined as the center of the center portion 101a of the target mark 101 (steps L12, L13).

Also, as shown in FIG. 6, if the center of the cursor 14 of the monitor screen 4 is located in the printed portion 101c next to the innermost central portion 101a, scanning from the center of the cursor 14 to a range of, for example, 2 mm at every 30 degree (steps L14, L15, L16, L17), as well as scanning of the starting point W of a same level of intensity to the center portion 101a (step L1) is performed. Thereafter, the above-mentioned steps L2 to L13 are performed from the starting point W as above.

If the center portion 101a of the target mark 101 and its center has not been detected on the last scanning line, the process is treated as an error (step L18).

Therefore, the center of the central portion 101a of the target mark can be accurately and rapidly detected, even when the workpiece 100 is driven with such a driving error that the center of the cursor 14 is located within the center portion 101a of the target mark 101, or such error as the center of the cursor 14 being located in the printed portion 101c next to the innermost center portion 101a of the target mark 101 occurs.

The fourth embodiment of the present invention will now be described. This embodiment incorporates a method capable of detecting the center position of the target mark 101 if the center of the target mark 101 can be located on the view area of the monitor screen 4, regardless of the amount of the driving error transport (error of the workpiece).

In this embodiment, the structure is similar to the previously described embodiments, except that a plurality of scanning reference points Bn are provided on the monitor screen 4 to display the binary-encoded image by the image processing unit 13 in the vertical and horizontal direction, each point being spaced apart from the other by a predetermined distance. The control program for scanning from the scan reference points in the predetermined order is executed by the central processing unit 33.

Since the computer-control may complete the scan once it detects a point of the same gradation level to that within the center portion 101a of the target mark 101 during the scan of the binary-encoded image and does not continue the scan beyond, the scan is limited to that range so that the center may not be detected. As stated before, when either the center portion 101a of the target mark 101 is located in the center of the cursor 14 of the monitor screen 4 (which displays the binary-encoded image) or when the printed circular portion 101c adjacent to the center portion 101a of the target mark 101 is located in the center of cursor 14, the detection of the center may be achieved by scanning from one point (the center of the cursor). However, if the driving error is still larger, it may not be possible to detect the center of the target mark using the aforementioned method of the third embodiment.

In order to prevent his from happening, in the fourth embodiment, a plurality of scan reference points Bn, including the center of the cursor 14, are horizontally and vertically provided on the monitor screen 4 at predetermined distances.

Although there are shown nine reference points in the figure for this embodiment, the number of reference points is arbitrary. The more the number of reference points, the greater the efficiency of the case when the shape of the complexity of the target mark increases.

The control program will now be described with reference to the enlarged view of the monitor screen, which indicates scanning of the binary-encoded image that has been processed by the image-processing unit, as shown in FIG. 10, and the flow chart of the program to be executed in the central processing unit of the boring machine, as shown in FIG. 11 and FIG. 12.

The control program is one that successively performs the scan in the order of the reference points until it detects the center of the center portion of the target mark. In the following explanation of the program, each of the steps is numbered after that of the third embodiment mentioned above.

Initially, the target mark 101 is captured and converted to an image signal at the imaging station 2. Then, the image signal is processed by the image processing unit 13 to be enlarged and displayed on the monitor screen 4.

By starting the scan based on the reference point B1, it is determined whether the reference point B1 is located in the area of the same level of intensity to the center portion 101a of the target mark 101.

In FIG. 10, reference point B1 is located in the area of the same level of intensity to the center portion 101a of the target mark 101. Thus, the steps from L2 to L10 and from L14 to L17 are successively performed from this point.

However, as the distances between the X and Y points are not matched with the reference diameter for the central portion 101a of the target mark 101, it is determined that the central portion 101a is not here.

Then, the scan based on reference point B2 starts. As point B2 resides in the outermost printed circle 101c of the level of intensity different from the center portion 101a of the target mark 101, scanning from the reference point B2 to a range, for example, of 2 mm at every 30 degree (steps L14, L15, L16, L17) is performed to try to detect the starting point (not shown) of the same gradation to the center portion 101a. Then, the steps from L2 to L10 are performed from that starting point (not shown).

Due to the control characteristics that do not continue the scan once a point of the same gradation to the center portion 101a of the target mark 101 is detected, the steps from 12 to L10 and from L14 to L17 are successively executed on the circumference area 101b between the outermost printed area 101c and the printed area 101c next to the outermost area, so that it is determined that the center portion 101a is not here.

Then, the scan based on reference point B3 starts.

Reference point B3 resides in the circumference area 101b of the same gradation to the center portion 101a of the target mark 101, so that the steps from L2 to L10 and from L14 to L17 are executed. However, it is determined that the center is not here, similar to the scan based on the reference point B1, as mentioned above.

The scan based on point B4 may lead to the same results as the scan based on point B1. For the scan based on point B5, since it is located in the printed area 101c of the different gradation to the center portion of the target mart 101, scanning from reference point B2 to a range of, for example, 2 mm at every 30 degree (steps L14, L15, L16, L17) is performed to try to detect the starting point (not shown) of the same gradation to the center portion 101a (step L1). Thereafter, the steps from L2 to L13 are successively performed for that starting point (not shown). As a result, it is determined that the center portion 101a is not here.

Then, the scan based on reference point B6 starts. Point B6 resides in the printed area 101b of the level of intensity different from the center portion 101a of the target mark 101. Scanning from reference point B6 to a range of, for example, 2 mm at every 30 degree (steps L14, L15, L16, L17) is performed to try to detect the starting point W (not shown) of the same gradation to the center portion 101a (step L1). Thereafter, the steps from L2 to L13 are performed from that starting point (now shown), and the center of the central portion 101a is detected for the first time.

If the center of the central portion 101a of the target mark is not detected from the scan based on reference point B6, the scan based on point B7, B8, B9 may be successively performed. If the center is not yet detected, it is determined that the driving error is too large, so that the process is treated as an error (step L18). In the case of an error, either an error message is displayed on the monitor screen 4 or a beep is generated.

As stated above, the method of the fourth embodiment is that a plurality of reference points B1, B2, B3, B4, B5, B6, B7, B8 and B9 are provided on the monitor screen 4, including the center of the cursor 14, each point being apart from others at the same distance, both horizontally and vertically, for scanning in the radial direction at a predetermined angle from each reference point B1, B2, B3, B4, B5, B6, B7, B8 and B9 in this order. The detection of the center is possible from the scan based on any one reference point if the center of the target mark 101 is located anywhere in the monitor screen 4.

The most suitable control program among the first, second, third, and fourth embodiments is selected according to the shape of the target mark provided on the workpiece.

The fifth embodiment of the present invention will now be explained. In this embodiment, there is provided a method for correcting the measured surface area of the target mark as a pre-process of the first to fourth embodiments.

If the center is detected while the edge of the target mark in the binary data (binary image) is unclear, due to a change of illumination in the imaging station 2 or any blur of printing, there may be some error when detecting the center position. As a result, a boring error of the reference holes may cause a decrease in the yields.

In order to prevent this from happening, a correction of the measured surface of the binary-encoded image is carried out.

The program which corrects the measurements of the surface is incorporated in the ROM 53 to be run by the central processing unit 33.

The method for correcting the measured surface will now be explained with reference to the flow chart shown in FIG. 13.

The target mark 101 of the workpiece 100 transported by the workpiece driving apparatus (not shown) to be positioned just beneath the imaging station 2 is captured at the imaging station 2. The image signal is binary encoded by the image processing unit 13 and written to the image memory 23. The binary-encoded image is also displayed on the monitor 4.

By opening a window for encompassing the entire screen of the monitor 4, the diameter and the surface of the target mark 101 is measured (measurement of the gravity center) in a black-and-white reversing coordination system (step M1).

Then, the measurements of the diameter and the surface of the target mark obtained by the gravity center measurement are compared with the reference value which is stored in RAM 43 by teaching ("teaching" means manually setting the most suitable threshold level while viewing the target marks and measuring the gravity center to be obtained) (step M2).

Accordingly, if the measurements are smaller than the reference value, the threshold (e.g., slicing level) is increased in a stepwise fashion by the image processing unit 13 (step M3). If the measurements are larger, the threshold is decreased in a stepwise fashion by the same image processing unit 13 (step M4), so as to extend (or shrink) the black-and-white reversing coordination system for the binary-encoded image of the target mark 101. The measurement of the gravity center is performed each time (step M2) to approximate the measurements to the reference value. The final measurements of the diameter and surface are determined only when the diameter and surface are corrected to be within an acceptable limit (e.g., acceptable range) of the reference values.

As a result, even if the edge of the target mark 101 in the binary data (binary-encoded image) is unclear when the illumination varies at the imaging station 2, or when there is any blur, the detection of the center position of the target marks (which is performed as post-processing in the first to fourth embodiments) is allowed to be more accurately achieved.

Also, in the method of correcting the measured surface, if the diameter or the surface of the target mark is out of range (out of limit), it is determined that the target marks are missing to some extent, so that neither detection of the center nor boring by using the drilling device is performed.

The sixth embodiment of the present invention will now be described. In this embodiment, there is provided a method for correcting the amount of movement at the driving mechanism of the boring device, in addition to a method of detecting the center position of the target marks and the method of correcting the measured surface of the target marks according to the first, second, third and fourth embodiments.

After using the method of any one of the first, second, third and fourth embodiments to detect the center of the target mark 101, a fine adjustment (correcting adjustments) of the drilling device 5 may be performed by the X-axis and Y-axis drilling mechanism 6 to coincide the center axis of the drilling device with the center of the target mark 101. Then, at that position, the drilling device is elevated by the Z-axis driving mechanism for boring the center of the target mark 101. Even though the X-axis and Y-axis driving mechanism 6 is driven by its control means (e.g., the X-axis and Y-axis driver circuit) by instructing the amount of movement according to the theory, since there exist driving errors, such as derived from nuts and bolts or from belts in the X-axis and Y-axis driving mechanism 6, the drilling device may (or may not) be correctly positioned with the theoretical accuracy. Therefore, problems of poor accuracy of the boring position arise.

The method of correcting the driving amount of the driving mechanism for the drilling device according to the present invention is one for previously correcting this type of error, and its correction program is incorporated in the ROM 53.

FIG. 15 shows a flow chart of the program for correcting the driving amount.

The method of correcting the driving amount of the driving mechanism for the drilling device according to the present invention will now be described below, with reference to the monitor screen shown in FIG. 14 and the flow chart shown in FIG. 15.

This driving amount correcting program measures the amount of driving error of the X-axis and Y-axis driving mechanism 6 to find (in advance) the correction ratio between a theoretical value and an actual value. Any boards which can be bored may be used for the drilling object.

The method of correcting the driving amount of the driving mechanism for the drilling device is achieved by using the drilling device A of the first embodiment before the detection of the center position (or the correction of the measured surface).

At first, a hole C is bored at the point of original temporally provided on the board to be the boring object (step R1). Then, the center of hole C is determined by measuring the gravity center of hole C stored in the RAM 43 (step R2).

Next, the object is moved by a length L, using the X-axis and Y-axis driving mechanism 6, to bore another hole D at that position (step R3).

Then, the center of hole D is determined by measuring the gravity center of hole D, which is stored in the RAM 43 (step R4).

Next, the correction ratio of the theoretical distance (L) between the centers of hole C and hole D (theoretical distance of the drilled positions on the drilling object) with the substantial distance of movement (1) is calculated (equation: instructed point of movement×(L/1)), and stored in the RAM 43 (step R5).

Further, holes E, F and G are bored by driving the object by amount L in the same or opposite direction, for determining the respective center by the measurement of the gravity center as noted above. Then, by using the equation noted above, the correction ratio for each of the holes is calculated and stored in the RAM 43 to determine the parameters passed to the X-axis and Y-axis driver circuit 9 connected to the X-axis and Y-axis driving mechanism 6 (step R6).

That is, the correction ratio of the theoretical distance (L) between respective centers of hole D and hole E (referred to as DE hereinbelow), hole C and hole E (referred to as CE hereinbelow), hole C and hole F (referred to as CF hereinbelow), and hole C and hole G (referred to as CG hereinbelow), to the substantial distance of displacement (1) of the drilling device is calculated and stored in RAM 43.

Also, although not shown in the flow chart, the correction ratio of the theoretical distance (L) between centers of hole E and hole C to the substantial distance of displacement (1)

of the drilling device 5 may be obtained by adding the correction ratio DE to the correction ratio CD and then dividing by 2. The correction ratio of the theoretical distance (L) between the centers of hole C and hole G to the substantial distance of displacement (1) of the drilling device 5 may be obtained by adding the correction ratio CF to the correction ratio CG, and then dividing by 2.

Therefore, at the time the center of the target mark 101 coincides with the center of the drilling device 5 by a fine adjustment (correcting adjustment) of the drilling device 5 in the direction of X-axis and Y-axis through the X-axis and Y-axis driving mechanism 6 by the amount of error from the center of the detected target mark, the central processing unit 33 controls the X-axis and Y-axis driver circuit 9 with the correction ratio according to the theoretical value (L) of the center-to-center distance of [(DE),(CE),(CF),(FG),CD), (CG)] suitable to both the distance and the direction of that fine adjustment (forward or backward from the origin to drive the X-axis and Y-axis driving mechanism 6 to displace the driving device 5 just beneath the center of the target mark 101. Then, by elevating the drill 5 using the Z-axis driving mechanism 7, comprising the solenoid 7a and the air cylinder 7b, the drilling at the center of the target mark 101 is achieved.

Although the distance between holes (CD), (DE), (CF), (FG) is assumed to be constant, given that a larger fine adjustment (correcting adjustment) of the drilling device causes a larger driving error of the X-axis and Y-axis driving mechanism 6, it may be possible to add further measuring points between each of the (CE) and (CG) points to enable the determination of the correction ratio with the larger number of points. In addition, it may also be possible to additionally provide a point H or a point I outside of point E or point G so as to be able to deal with the case where the amount of error between the center of the target mark and the center of the drilling device is still larger.

In the sixth embodiment, an explanation has been provided for the case in which the boring points are positioned on a diagonal axis intersection on the origin at a constant distance. It may be possible to form the structure capable to obtain the correction ratio free of a direction by providing, for example, drilling points on the crossing lines (or radial lines) intersecting the origin at the constant distance. This allows a high accuracy of correction to be achieved, by selecting a suitable correction ratio from the nearest direction to the error direction of the drilling device 5 in relation to the center of the target mark 101, to thereby drive the X-axis and Y-axis driving mechanism 6 for each drilling.

The seventh embodiment of the present invention will now be described below. In this embodiment, a method for checking the existence (or the absence) of the reference hole bored at a disk-shaped target mark 101 is provided.

If the drilling device is fractured, due to metal fatigue or some accident, the fractured drilling device, set to a predetermined driving amount (elevating amount) by the Z-axis driving mechanism 7 can not bore. As a result of successive boring of the reference hole, there may be produced a number of defective products having no reference hole bored. The method for checking the existence (or the absence) of the reference hole is provided for preventing this from happening.

This embodiment is similar to the first embodiment, except that in the boring apparatus A, the illumination for imaging the image signal at the imaging station 2 (as described in the first embodiment) is performed by an LED 10 attached at a periphery of the drill guiding hole provided under the table 1, as opposed to the imaging station 2 on the table 1.

Figure 17:
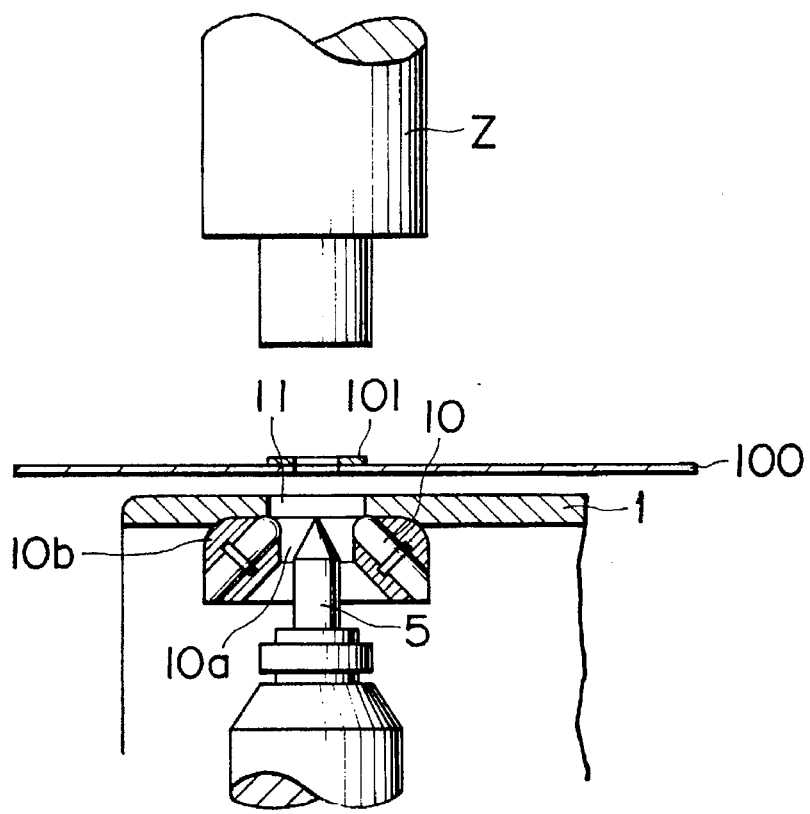
FIG. 17 is a front sectional view indicating a checking of a bored reference hole.
Figure 18:
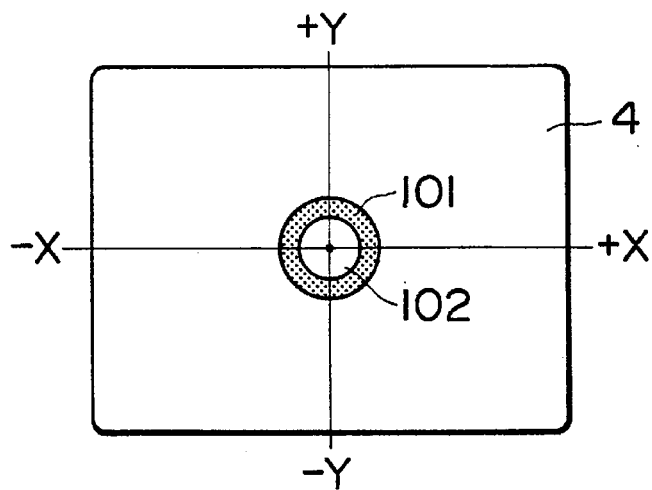
FIG. 18 is an enlarged view of the monitor screen indicating the binary image of the bored reference hole and the rest of the target mask.

LEDs 10 communicate with the drill guiding hole 11 opened in the table 1, as shown in FIG. 17, and are embedded slantingly and radially in a circular holding plate having a plurality of communicating holes 10a which are slightly smaller than the guiding hole 11. The holding plate is attached to the table 1 with a drill guiding hole 11 aligned to a center of the communicating holes 10a so as to emit a light beam from the drill guiding hole 11 in an upward direction.

Figure 20:
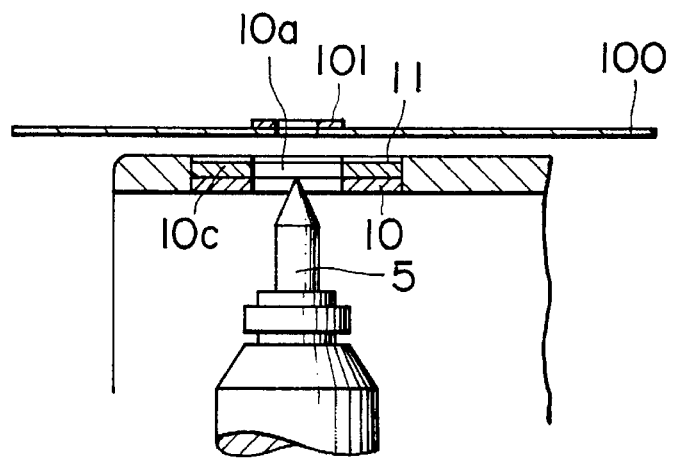
FIG. 20 is a front sectional view of another embodiment indicating an arrangement of an LED forming light emitting means.
Figure 21:
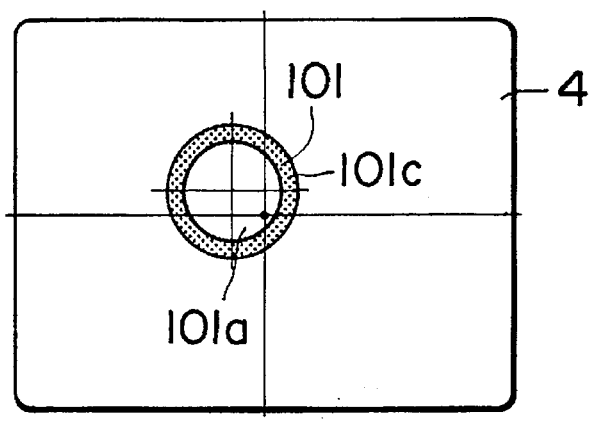
FIG. 21 is an enlarged view of the monitor screen indicating binary image of the image-processed target mark according to an eighth embodiment of the present invention, before a negative-to-positive inversion of the image.
Figure 22:
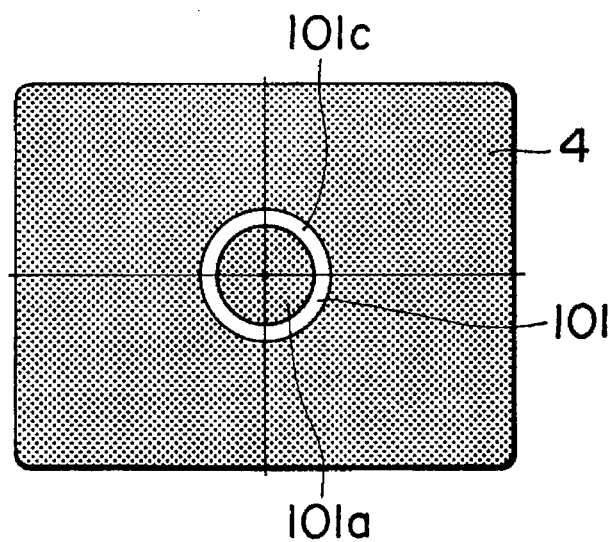
FIG. 22 is an enlarged view of the monitor screen indicating binary image of the inverted target mark.
Figure 23:
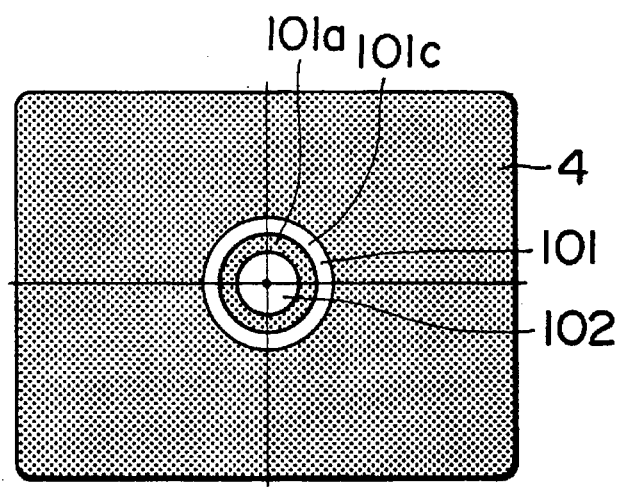
FIG. 23 is an enlarged view of the monitor screen indicating binary image of the bored reference hole and the rest of a central portion of the target mark.

LEDs 10 may also be attached in the manner illustrated in FIG. 20.

LEDs 10 are attached in a single plane (radially or diagonally) in the top plan view under a circular plate 10c formed of transparent or opaque resin having communicating holes 10a communicating with the drill guiding hole 11, and are fixed to engage with the inner surface of the drill guiding hole 11.

The program for checking the existence (or the absence) of the reference holes is incorporated in the ROM 53 and executed by the central processing unit 33.

Figure 19:
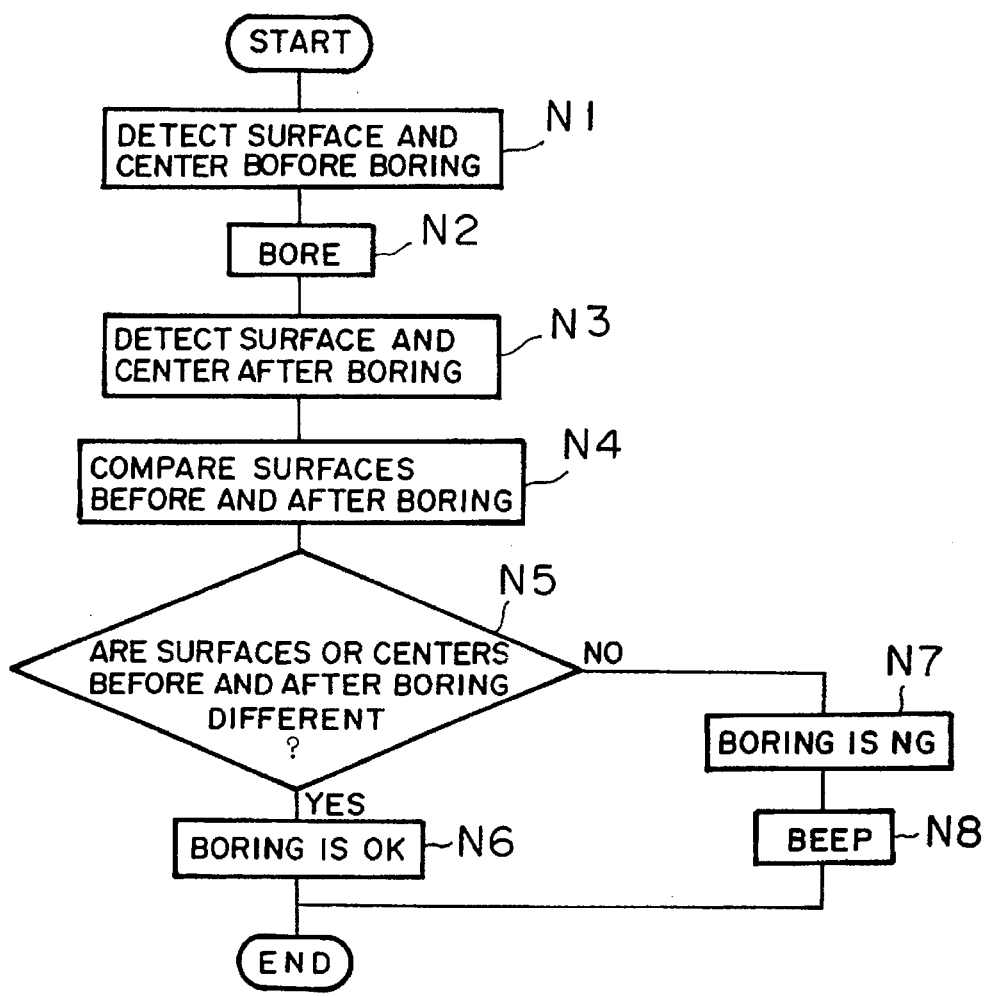
FIG. 19 is a program chart of a seventh embodiment of the present invention.

The control program will now be described with reference to FIG. 19.

As stated above, the center position of the target mark 101 is detected before boring the reference hole with the method of detecting the center position of the target mark according to the first embodiment. The surface is calculated and stored in RAM 43 (step N1). The drilling device 5 is moved in the X-axis and Y-axis directions by means of the X-axis and Y-axis driving mechanism 6, based on the correcting method of the driving amount of the driving mechanism for the drilling device according to the sixth embodiment. The drilling device 5 is elevated by the Z-axis driving mechanism 7 to bore the reference hole 102 (step N2). The black surface (negative) area in the binary-encoded image residing after boring is calculated in the image processing unit 13 to detect the center of the hole and stored in RAM 43 (step N3). Since the diameter of the bore created by the drilling device is slightly smaller than the diameter of the target mark 101, the bored reference hole 102 is determined as white (positive) in the binary-encoded image, as shown on monitor screen 4 (see FIG. 18). At the circumference there exists the circular target mark 101, which is determined as black (negative), the surface of which is calculated by analysis.

Then, the black surface (negative) area before boring is compared with the black surface (negative) after boring (step N4).

By matching both black (negative) surfaces (step N5), it is determined that the boring has been performed correctly (step N6) if both surfaces are different. If both surfaces are the same, it is determined that the boring has not been achieved (step N7), in which event the program automatically stops the X-axis and Y-axis driving mechanism 6, the Z-axis driving mechanism 7 and the workpiece transporting apparatus (not shown) and beeps (step N8).

As stated above, the seventh embodiment provides LEDs 10 that emit a light beam so as to obtain the transmission image required for the hole check. It is harmless for the workpiece 100 and it does not cause distortions which may inhibit the detection of the center of the target mark 101. In addition, checking of the existence and the absence of the bored reference hole 102 can be performed for each hole. Furthermore, as it automatically stops the X-axis and Y-axis driving mechanism 6, the Z-axis driving mechanism 7 and the workpiece transporting apparatus (not shown) and beeps, the drilling device can be immediately replaced.

The eighth embodiment of the present invention will now be described. In this embodiment, checking of the bored reference hole 102 at the center portion 101a of the target mark 101 formed by the center portion 101a of the substrate of the workpiece and the copper-foil printed circular area 101c at the circumference thereof is achieved.

In this embodiment, as the arrangement of the drilling apparatus A and the downward emission of light by using LED 10 are quite similar to the previous embodiments, the description thereof is omitted.

Next, the control program is described with reference to FIG. 24.

The image processing unit 13 reverses (negative-positive) the binary encoded image (see FIG. 21) to display an enlarged view on the monitor screen 4 with the target mark in white (positive) and the center portion in black (negative) (see FIG. 22) (step P1). As stated above, after detecting the center position of the target mark 101 before boring the reference hole using the method of detecting the center position of the target mark according to the third or fourth embodiment, the surface is calculated and stored in RAM 43 (step P2). The drilling device 5 is moved in the X-axis and Y-axis directions by means of the X-axis and Y-axis driving mechanism 6, based on the correcting method of the driving amount of the driving mechanism for the drilling device according to the sixth embodiment. The driving device 5 is moved up by means of Z-axis driving mechanism 7 to bore the reference hole 102 (step P3).

Then, the black (negative) surface area in the binary-encoded image residing after boring is calculated in the image processing unit 13 to detect the center of the hole and stored in RAM 43 (step P4). That is, as the diameter of the drilling device is slightly smaller than the diameter of the target mark 101, the bored reference hole 102 may be determined as white (see FIG. 23), and at the circumference there exists the circular target mark 101 which is determined as black (negative), the surface of which is calculated by analysis.

Then, the black (negative) surface area before boring is compared with the black (negative) surface after boring (step P5). Thereafter, by matching both black (negative) surfaces (step P6), it is determined that the boring has been performed correctly (step P7) if both surfaces are different. It both surfaces are the same, it is determined that the boring has not been achieved (step P8). In this event, the program automatically stops the X-axis and Y-axis driving mechanism 6, the Z-axis driving mechanism 7 and the workpiece transporting apparatus (not shown) and beeps (step P9), similar to the first embodiment.

Consequently, this may achieve an effect quite similar to the seventh embodiment.

In accordance with the shape of the target marks provided on the workpiece, the most suitable control program may be selected from the seventh and eighth embodiments.

Having described specific preferred embodiments of the invention with reference to the accompanying drawings, it is appreciated that the present invention is not limited to those precise embodiments, and that various changes and modifications can be effected therein by one of ordinary skill in the art without departing from the scope and spirit of the invention, as defined by the appended claims.

What is claimed is:

1. A method for determining a center of a target mark provided on a workpiece by image processing, comprising the steps of:

imaging a disk-shaped target mark at an imaging station;

binary-encoding an image signal, obtained from the imaging station, in an image processing apparatus;

displaying the binary-encoded image signal on a monitor screen connected to the image processor;

detecting starting points X1 and X2 of a first level of intensity by scanning in at least one of an X-axis direction and a Y-axis direction relative to a center of a cursor, associated with the monitor screen, when the center of the cursor is located within the target mark;

detecting other starting points Y1 and Y2 of a second level of intensity by scanning in another of the X-axis direction and the Y-axis direction on a mid-point of coordinates of the starting points X1 and X2;

detecting other starting points X1' and X2' of a third level of intensity by scanning, parallel to a direction of the starting points X1 and X2, a mid-point of coordinates of the starting points Y1 and Y2;

comparing a reference value of a diameter in the X-axis direction and the Y-axis direction of the target mark stored in a memory with a distance between Y1 and Y2 and a distance between X1' and X2' to determine an intersection point of segments between points Y1 and Y2 and X1' and X2' as the center of the target mark when the comparison matches.

2. A method for determining a center of a target mark by image processing, comprising the steps of:

imaging target marks provided on a workpiece at an imaging station, the target marks having a disk-shaped center portion and a plurality of circumferential areas of a same intensity thereto with a plurality of circular concentric areas of different intensity to the center portion therebetween;

binary encoding an image signal, obtained from the imaging station, at an image processing unit;

detecting a starting point W of the same level of intensity as the center portion by scanning the binary-encoded image in radial directions separated from each other by a predetermined angle relative to a center of a cursor, associated with a monitor screen, when the center of the cursor is not located in the center portion of the binary-encoded target mark;

detecting starting points X1 and X2, having a different level of intensity from the center portion, by scanning an area of a same level of intensity to the starting point W in at least one of the X-axis direction and Y-axis direction;

detecting starting points Y1 and Y2, having another level of intensity from the center portion, by scanning, in another axial direction, a mid-point of coordinates between the starting points X1 and X2 of that intensity;

detecting starting points X1' and X2', having an other level of intensity from the center portion, by scanning, parallel to a direction of the starting points X1 and X2, a mid-point of coordinates between the starting points Y1 and Y2;

comparing a reference value, stored in a memory, of a diameter in the X-axis direction and the Y-axis direction with a distance between starting points Y1 and Y2 and a distance between starting points X1' and X2'; and determining an intersection point of two segments of the starting points Y1 and Y2 and of the starting points X1' and X2' as the center of the target mark when the distances match the reference value of the diameter.

3. The method of claim 2, further comprising the steps of: scanning the center portion in at least one of diagonal or radial directions with a preferred degree of inclination, intersecting the determined center to detect starting points Z1 and Z2 having a different level of intensity from the center portion, and determining the detected center as the center of the target mark if the starting points Z1 and Z2 match the reference value of the diameter in the X-axis direction and the Y-axis direction of the center portion, the reference value of the diameter being stored to the memory.

4. A method for determining a center of a target mark by image processing, comprising the steps of:

imaging a target mark provided on a workpiece at an imaging station, the target mark comprising:
a disk-shaped center portion; and
a plurality of circumferential areas of a same intensity thereto with a plurality of circular concentric areas of different intensity to the center portion therebetween;

binary encoding an image signal, obtained from the imaging station, at an image processing unit;

displaying the binary-encoded image on a monitor screen connected to the image processor;

providing a plurality of reference scanning points at a constant distance therebetween on the monitor screen;

detecting a starting point W, having a level of intensity substantially equal to the center portion, by scanning the binary-encoded image in radial directions apart from each other at a predetermined angle on a center of a cursor associated with the monitor screen in a predetermined order;

detecting starting points X1 and X2, having a different level of intensity from the center portion, by further scanning from the starting point W to one of an X-axis direction and a Y-axis direction in that area of intensity;

detecting starting points Y1 and Y2, having another level of intensity from the center portion, by scanning in another axial direction on the mid-point of coordinates between the starting points X1 and X2 of that intensity;

detecting starting points X1' and X2', having an other level of intensity from the center portion, by scanning in parallel to the direction of the starting points X1 and X2 on a mid-point of coordinates between the starting points Y1 and Y2;

comparing a reference value, stored in a memory, of a diameter in the X-axis direction and the Y-axis direction with a distance between starting points Y1 and Y2 and a distance between starting points X1' and X2'; and determining an intersection point of two segments of the starting points Y1 and Y2 and the starting points X1' and X2' as the center of the target mark when the distances match the reference value of the diameter.

5. The method of claim 4, further comprising the steps of:
scanning the center portion in diagonal or radial directions with a preferred degree of inclination, intersecting the determined center to detect starting points Z1 and Z2 having a different level of intensity from the center portion, and determining the detected center as the center of the target mark if the starting points Z1 and Z2 match the reference value of the diameter in the X-axis direction and the Y-axis direction of the center portion, the reference value of diameter being stored to the memory.

6. A method for determining a center of a target mark provided on a workpiece by image processing, comprising the steps of:

binary-encoding an image signal representing a target mark;

displaying the binary-encoded image signal;

detecting starting points X1 and X2 by scanning the target mark in at least one of an X-axis direction and a Y-axis direction;

detecting other starting points Y1 and Y2 by scanning in another of the X-axis direction and the Y-axis direction on a mid-point of coordinates of the starting points X1 and X2;

detecting other starting points X1' and X2' by scanning, parallel to a direction of the starting points X1 and X2, a mid-point of coordinates of the starting points Y1 and Y2;

comparing a reference value with a distance between Y1 and Y2 and a distance between X1' and X2'; and determining an intersection point of segments between points Y1 and Y2 and X1' and X2' as the center of the target mark when the comparison matches.

* * * * *